US008217697B2

(12) United States Patent
Satterfield

(10) Patent No.: US 8,217,697 B2
(45) Date of Patent: Jul. 10, 2012

(54) FAULT TOLERANT REDUNDANT CLOCK CIRCUIT

(75) Inventor: Harold William Satterfield, Rockledge, FL (US)

(73) Assignee: Intersil Americas Inc., Milpitas, CA (US)

( * ) Notice: Subject to any disclaimer, the term of this patent is extended or adjusted under 35 U.S.C. 154(b) by 415 days.

(21) Appl. No.: 12/620,454

(22) Filed: Nov. 17, 2009

(65) Prior Publication Data

US 2010/0127679 A1 May 27, 2010

Related U.S. Application Data

(60) Provisional application No. 61/116,269, filed on Nov. 19, 2008.

(51) Int. Cl.
*H03K 3/027* (2006.01)
*H03K 3/013* (2006.01)
(52) U.S. Cl. ...................................................... 327/291
(58) Field of Classification Search .................. 327/144,
327/291, 292, 296, 526; 331/46, 49; 714/797;
326/11; 323/284, 288
See application file for complete search history.

(56) References Cited

U.S. PATENT DOCUMENTS

| 4,644,498 | A | * | 2/1987 | Bedard et al. ...................... 714/3 |
| 5,426,384 | A | * | 6/1995 | May ................................ 327/52 |
| 5,557,623 | A | * | 9/1996 | Discoll ........................ 714/814 |
| 5,886,586 | A | * | 3/1999 | Lai et al. ....................... 332/109 |
| 5,982,209 | A | * | 11/1999 | Magazzu' et al. ............. 327/144 |
| 7,397,314 | B2 | * | 7/2008 | Wissell ............................ 331/49 |
| 7,467,320 | B2 | * | 12/2008 | Chang et al. .................. 713/501 |
| 7,504,810 | B1 | * | 3/2009 | Tagare .......................... 323/282 |

* cited by examiner

*Primary Examiner* — Gary L Laxton
(74) *Attorney, Agent, or Firm* — Fogg & Powers LLC

(57) ABSTRACT

A clock generation circuit, includes, in part, a comparator, a logic unit, and a switching circuit. The switching circuit generates a signal that is applied to the comparator. If the input voltage level of the signal applied to the comparator is greater than a first reference voltage, the comparator asserts its first output signals. If the input voltage level of the signal applied to the comparator is less than a second reference voltage, the comparator asserts its second output signal. The output signals of the comparator form a first pair of feedback signals applied to the switching circuit. The logic unit responds to the output signals of the comparator to generate a second pair of oscillating feedback signals that are also applied to the switching circuit. The switching circuit varies a capacitor voltage in response to a reference current and in response to the two pairs of feedback signals it receives.

10 Claims, 6 Drawing Sheets

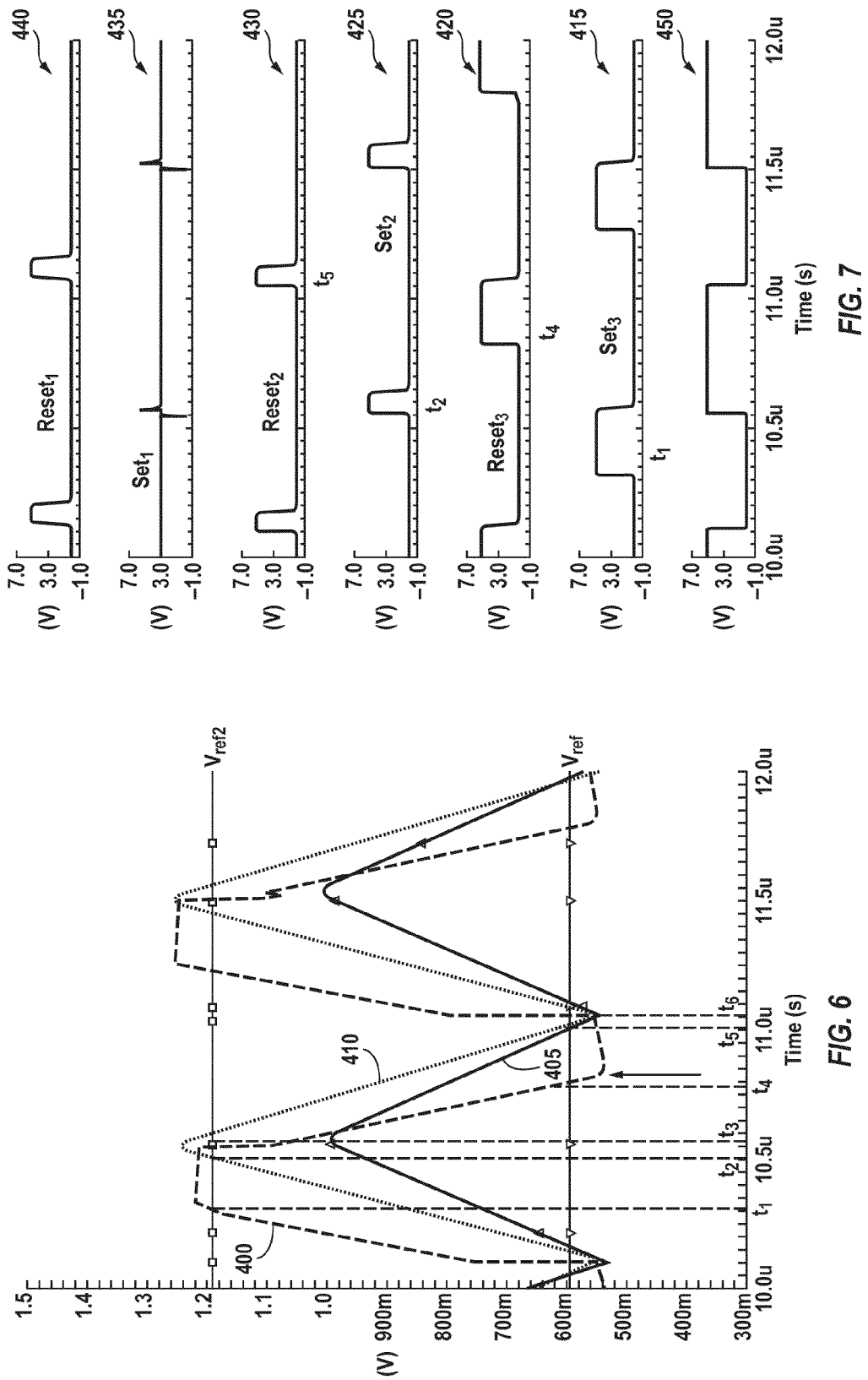

FAULT TOLERANT REDUNDANT CLOCK CIRCUIT

CROSS-REFERENCES TO RELATED APPLICATIONS

The present application claims benefit under 35 USC 119 (e) of U.S. provisional application No. 61/116,269, filed Nov. 19, 2008, entitled "Fault Tolerant Redundant Clock Circuit", the content of which is incorporated herein by reference in its entirety.

BRIEF DESCRIPTION OF THE DRAWINGS

FIG. 6 shows another exemplary simulation result of the capacitor voltages of the redundant clock generators associated with FIG. 3.

FIG. 7 shows the Set and Reset signals generated by the redundant clock generators of FIG. 3.

DETAILED DESCRIPTION OF THE INVENTION

A clock generation circuit, in accordance with one embodiment of the present invention, is immune to single transient and single permanent faults within the redundant circuits, and generates an oscillating signal without receiving an external clock signal. The oscillation is achieved by charging and discharging a capacitor and comparing the voltage developed across the capacitor to one or more predefined threshold values.

Figure 1:
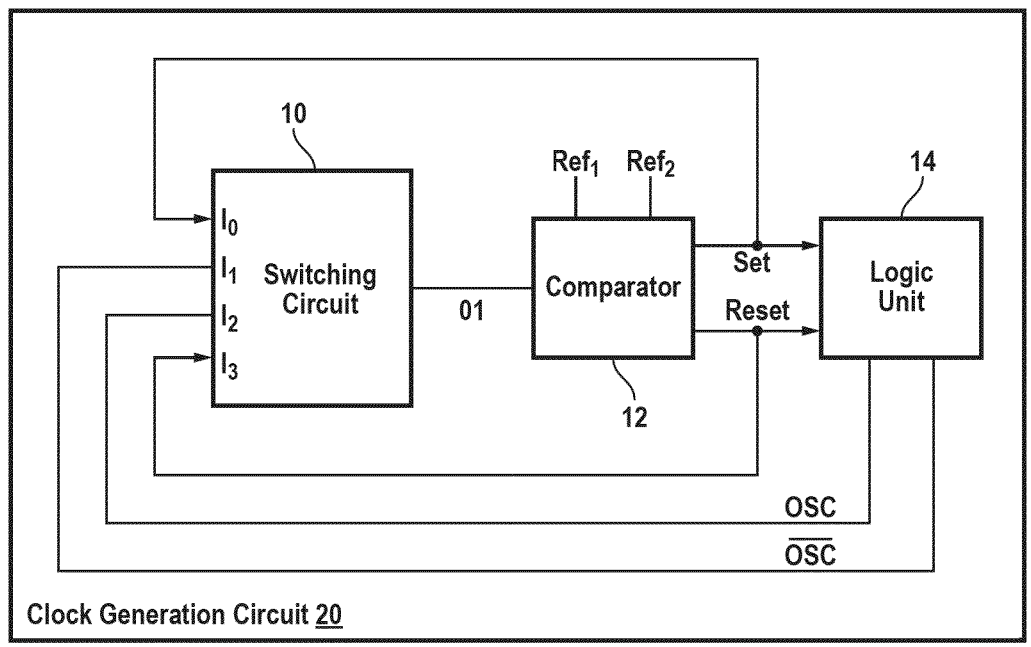
FIG. 1 is a block diagram of a clock generation circuit, in accordance with one exemplary embodiment of the present invention.

FIG. 1 is a block diagram of a clock generation circuit 20, in accordance with one exemplary embodiment of the present invention. Clock generation circuit 20 is shown as including a switching circuit 10, a comparator 12, and a logic unit 14. Switching circuit 10 generates a signal O1 that is applied to comparator 12. If the voltage level of signal O1 is detected by comparator 12 as being less than a first reference voltage Ref1, comparator 12 asserts its Reset output signals. If the voltage level of signal O1 applied to comparator 12 is detected as being greater than a second reference voltage Ref2, comparator 12 asserts its Set output signal. The Set and Reset output signals of comparator 12 form a first pair of feedback signals that are applied to switching circuit 10. The logic unit receives and signals Set and Reset and, in response, generates a second pair of clock signals OSC and $\overline{OSC}$ that are used as a second pair of feedback signals to switching circuit 10. The switching circuit varies the voltage across a capacitor (not shown in FIG. 1) in response to a reference current (not shown in FIG. 1) and further, in response to the feedback signals it receives. The voltage across the capacitor is the voltage signal O1 applied to the comparator. The output signals of the logic unit are the clock signals generated by the clock generation circuit. Oscillating signals OSC and $\overline{OSC}$ are true and complementary clock signals generated by clock generation circuit 20. In one embodiment, switching circuit 10 continuously charges, discharges, or floats a capacitor and compares the voltage developed across the capacitor to predefined threshold values in order to generate signals Set and Reset.

A clock generation circuit, in accordance with another embodiment of the present invention includes n redundant clock generators whose output signals are combined into a single fault-tolerant clock signal via m voters and a logic unit. The redundancy and voters allow proper clock operation even when a fault occurs within any one of the individual clock generators.

Figure 2:
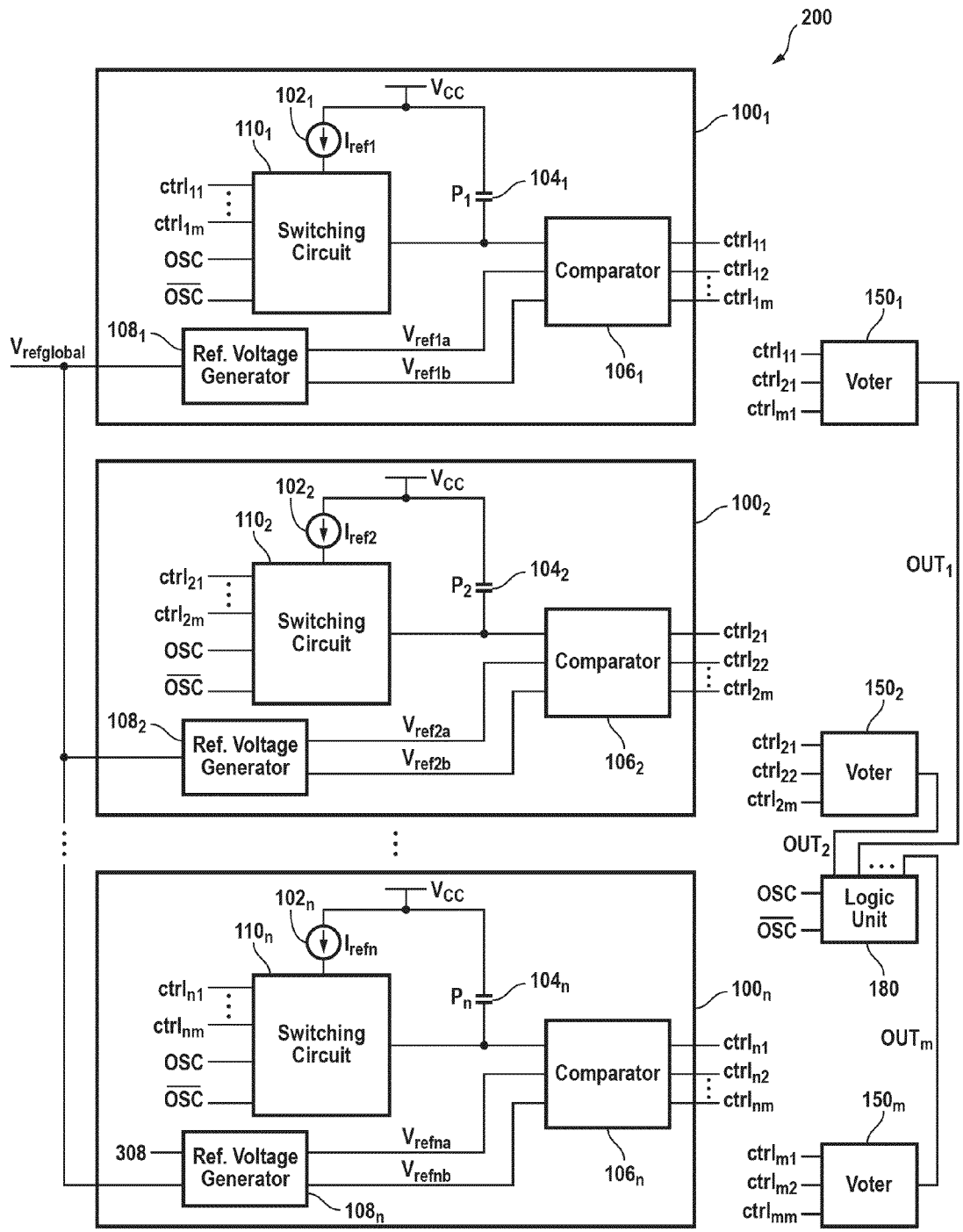
FIG. 2 is high-level block diagram of a clock generation circuit, in accordance with another exemplary embodiment of the present invention.

FIG. 2 is high-level block diagram of a clock generation circuit 200, in accordance with one exemplary embodiment of the present invention. Clock generation circuit 200 is shown as including, in part, N identical redundant clock generators $100_1, 100_2 \ldots 100_N$; M voters $150_1, 150_2 \ldots 100_M$; and a logic unit 180. It is understood that N and M are integers.

Each clock generator $100_i$, where i is an integer varying from 1 to N, is shown as including, in part, a reference current source $102_i$ a capacitor $104_i$ a comparator $106_i$, a reference voltage generator $108_i$ and a switching circuit $110_i$. For example, clock generator $100_1$ is shown as including, in part, a reference current source $102_1$, a capacitor $104_1$, a comparator $106_1$, a reference voltage generator $108_1$, and a switching circuit $110_1$. Likewise, clock generator $100_N$ is shown as including, in part, a reference current source $102_N$, a capacitor $104_N$, a comparator $106_N$, a reference voltage generator $108_N$, and a switching circuit $110_N$.

Each clock generator generates M control signals each of which is applied to a different one of M voters $150_j$, where j is an integer varying from 1 to M. For example, control signals $Ctrl_{11}, Ctrl_{12} \ldots Ctrl_{1M}$ generated by comparator $106_1$ are respectively applied to voters $150_1, 150_2 \ldots 150_M$. Control signals $Ctrl_{21}, Ctrl_{22} \ldots Ctrl_{2M}$ generated by comparator $106_2$ are respectively applied to voters $150_1, 150_2$ and $150_M$. Likewise, control signals $Ctrl_{N1}, Ctrl_{N2} \ldots Ctrl_{NM}$ generated by comparator $106_N$ are respectively applied to voters $150_1, 150_2$ and $150_M$, as shown. Logic unit 180 is configured to generate oscillating signals OSC and $\overline{OSC}$ in response to the output signals $Out_1, Out_2 \ldots Out_M$ generated by voters $150_1, 150_2 \ldots 150_M$.

The switching circuit $110_i$ and reference current $102_i$ disposed in clock generator $100_i$ are adapted to enable the voltage across the associated capacitor $104_i$ to charge, discharge or float in response to the signals OSC and $\overline{OSC}$ as well as to the clock generator's associated control signals $Ctrl_{i1}, Ctrl_{i2} \ldots Ctrl_{iM}$. For example, the voltage across capacitor $104_1$ is adapted to charge, discharge or float, as described further below, in response to the signals OSC, $\overline{OSC}$, and control signals $Ctrl_{11}, Ctrl_{12} \ldots Ctrl_{1M}$. Likewise, for example, the voltage across capacitor $104_N$ is adapted to charge, discharge or float, in response to signals OSC, $\overline{OSC}$, as well as to the clock generator's associated control signals $Ctrl_{N1}, Ctrl_{N2} \ldots Ctrl_{NM}$.

Each comparator $106_i$ is adapted to compare the voltage across its associated capacitor $104_i$ to its reference voltages $Vref_{ia}$ and $Vref_{ib}$, and to assert one of its output signals $Ctrl_{i1}, Ctrl_{i2} \ldots Ctrl_{iM}$ as a result of this comparison. Each voter $150_i$ may be a majority voter and generates an output signal $Out_i$ representative of the majority of the input vote signals the voter receives. The M voter output signals $OUT_1, OUT_2, \ldots$ $OUT_M$ are inputs to a logic unit 180. The M voter output signals that are inputs to the logic unit provide information about the voltage across the capacitors 104$i$. In response to these signals, the logic unit decides the state of the clock signals OSC and $\overline{OSC}$. As is described herein in detail, due to the redundancy and voters the signals OSC and $\overline{OSC}$ are fault tolerant clock signals that continue to oscillate even when a fault occurs within any one of the individual clock generators.

Figure 3:
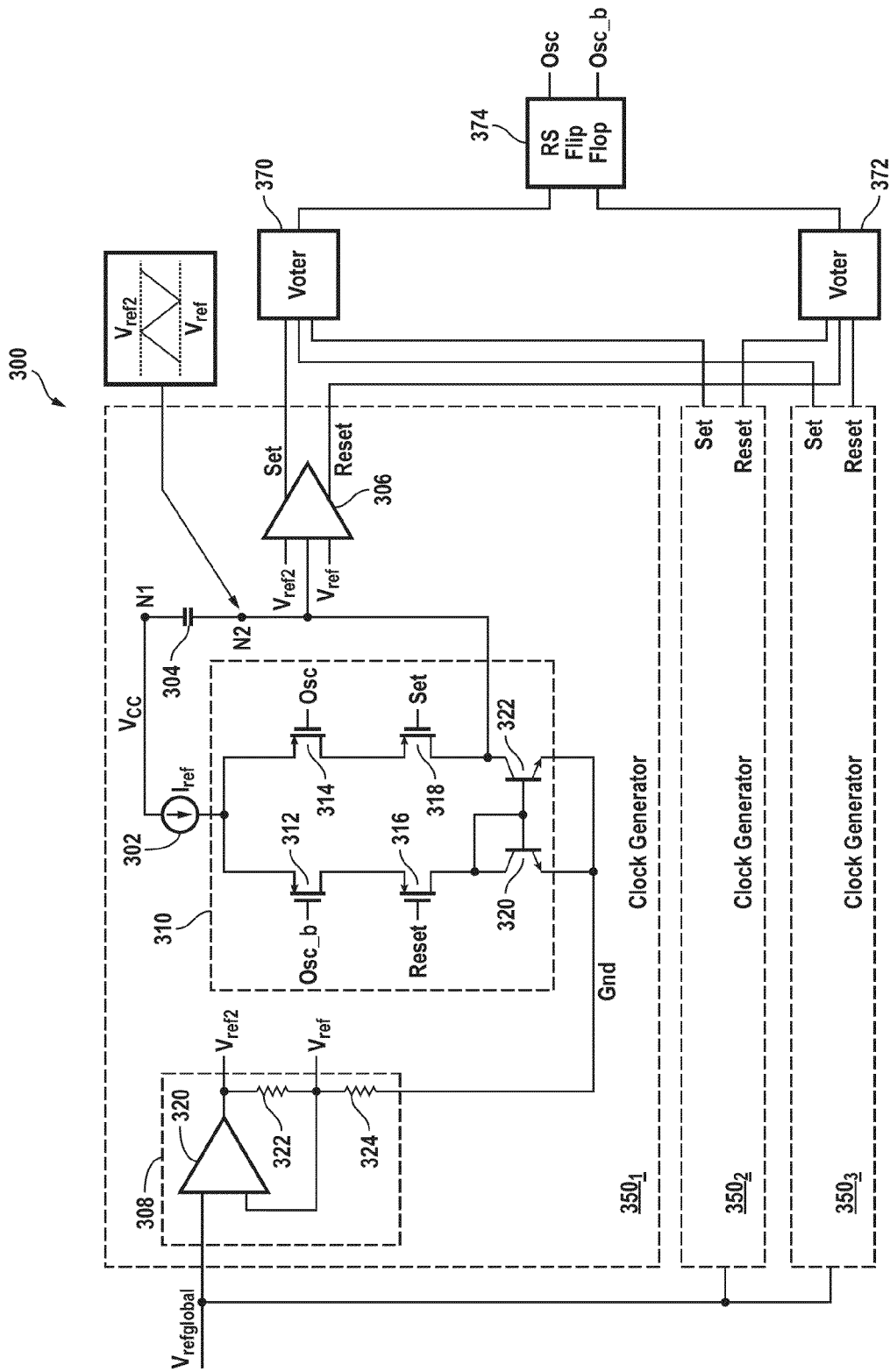
FIG. 3 is schematic diagram of a clock generation circuit, in accordance with another exemplary embodiment of the present invention.

FIG. 3 is schematic diagram of a clock generation circuit 300, in accordance with another exemplary embodiment of the present invention. Clock generation circuit 300 is shown as including, in part, three identical redundant clock generator circuits (clock generators) $350_1$, $350_2$ and $350_3$, a pair of voters 370, 372, and an RS flip-flop 374. Although only the components within redundant clock generator $350_1$ is shown, it is understood that clock generators $350_2$ and $350_3$ have similarly arranged components.

Clock generator $350_1$ is shown as including, in part, a switching circuit 310, a reference current source 302, a capacitor 304, a comparator 306, and a reference voltage generator 308. Reference voltage generator 308, shown as including an amplifier 320 and resistors 322 and 324, receives a global DC reference voltage Vrefglobal, and in response, generates reference voltages Vref and Vref2 that are supplied to comparator 306. Power supply voltages VCC, GND, the global reference voltage Vrefglobal, and hardened clock output signals OSC and $\overline{OSC}$ are common to all three redundant clock generators.

The reference currents (such as reference current 302) supplied to the three redundant clock generation circuits $350_1$, $350_2$, and $350_3$ are independent from another to ensure fault tolerance. The internal reference voltages, namely Vref and Vref2 are generated independently within each of the three redundant clock generation circuits to further ensure fault tolerance. Although the following description is provided with reference to clock generator $350_1$, it is understood that the remaining two clock generators operate in the same manner.

Switching circuit 310 is shown as including MOS transistors 312, 314, 316, 318, and bipolar transistors 320, 322. Switching circuit 310 is adapted to cause the voltage across capacitor 304 to either charge to reference voltage Vref2, or to discharge to reference voltage Vref, or to float, as described further below. The voltage ramp rate across capacitor 304 is defined by the capacitance of capacitor 304 and value of reference current $I_{REF}$ flowing from current source 302. Output signal Set of comparator 306 is at a logic high level when the voltage at node N2 of capacitor 304 is higher than reference voltage Vref2. Likewise, output signal Set of comparator 306 is at a logic low level when the voltage at node N2 is smaller than the reference voltage Vref2. Output signal Reset of comparator 306 is at a logic high level when the voltage at node N2 is lower than reference voltage Vref, and at a logic low level when the voltage at node N2 is higher than reference voltage Vref. Comparator 306 has hysteresis to avoid jitter of the signals Set and Reset.

During a capacitor voltage ramp-up cycle, signal $\overline{OSC}$ (labelled Osc_b in FIG. 3) is at a high level, and signals OSC and Set are at a low level. Consequently, PMOS transistor 312 is turned off, whereas transistors 314 and 318 are turned on. Bipolar transistors 320 and 322 are also turned off. Therefore, current $I_{REF}$ causes node N2 of capacitor 304 to charge. The charging continues until the voltage at node N2 is higher than reference voltage Vref2. When the voltage at node N2 exceeds Vref2, comparator 306 changes state thus causing signal Set to go high. Signal Reset remains low. When Set goes high, transistor 318 shuts off and the capacitor node N2 is floated and remains at the Vref2 voltage. This completes the charge cycle for the individual clock generator.

When the Set signal associated with two or more of the redundant clock generators $350_1$, $350_2$ and $350_3$ is at a high level, voter 370's output changes state to high, thereby causing output signal OSC of RS flip-flop 374 to go high and output signal $\overline{OSC}$ of RS flip-flop 374 to go low. This causes transistors 312 to be on, and transistor 314 to be off. Since capacitor node N2 is at Vref2 voltage at the completion of the charge cycle, the reset signal is low and transistor 316 is on. Accordingly, current $I_{REF}$ causes the base-emitter junction of transistor 320 to be forward biased thus causing bipolar transistors 320 and 322 to form a current mirror. With transistor 314 off, and transistor 322 sinking current $I_{REF}$, node N2 is discharged. The discharging of capacitor 304 continues until the voltage at node N2 falls just below reference voltage Vref, at which point comparator 306 changes state, thereby causing signal Reset to go high and Set remains low. When reset goes high, transistor 316 turns off and node N2 is floated and remains at the Vref voltage. This completes the discharge cycle for the individual clock generator.

When the Reset signal associated with two or more of the clock generators (redundant blocks) is at a high level, voter 372 changes state thereby causing output signal OSC of RS flip-flop 374 to go low and output signal $\overline{OSC}$ of RS flip-flop 374 to go high. This, in turn, causes the voltage across capacitor 304 to ramp up thereby causing repeated cycles of oscillations of signals OSC and $\overline{OSC}$, as described above.

Each of voters 370 and 372 may be a majority voter. The output of each majority voter goes high when two or more of its inputs are high. Likewise, the output of each majority voter goes low when two or more of its inputs are low. Majority voter 370 receives the Set signals from redundant clock generators $350_1$, $350_2$ and $350_3$. Majority voter 372 receives the Reset signals from redundant clock generators $350_1$, $350_2$ and $350_3$. The outputs of voters 370 and 372 are respectively applied to the Set and Reset input terminals of RS flip-flop 374. Each of voters 370, 372 and RS flip-flop 374 are designed to be single-event immune, as is well known, to withstand high energy particles when deployed in non-terrestrial applications such as satellites. Therefore, as a result of the redundancy, the output signals OSC and $\overline{OSC}$ of RS flip-flop 374 are fault-hardened clock signals and are also single-event immune.

As described above, output signals Set and Reset of comparator 306 are used as feedback signals to switching circuit 310, thereby enabling capacitor 304 to float when the voltage at node N2 is outside the voltage range defined by voltages Vref to Vref2. These feedback signals enable the redundant clock generators $350_1$, $350_2$ and $350_3$ to be synchronized. In the absence of the present invention, because of the inherent mismatches in electrical characteristics of the components used in redundant blocks $350_1$, $350_2$ and $350_3$, the capacitors may have different ramp rates, the reference currents may have different levels, etc., which in turn may result in the respective capacitor voltages to fall outside the normal operating range and destroy the synchronization of the redundant clocks. Such synchronization problems are overcome by using the feedback signals Set and Reset within the redundant blocks $350_1$, $350_2$ and $350_3$, as described above.

Figure 4:
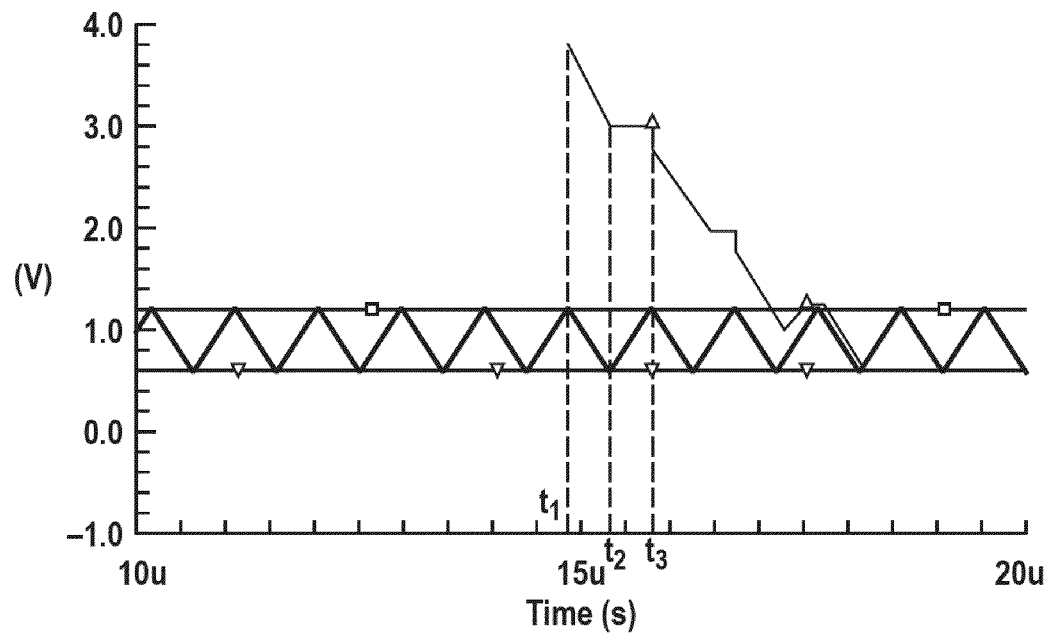
FIG. 4 shows exemplary simulation result of the capacitor voltages of the redundant clock generators of FIG. 3.

FIG. 4 is an exemplary simulation result of the capacitor voltages for the redundant clock generators of FIG. 1. Reference voltages Vref and Vref2 are selected as being 0.6 Volts and 1.2 Volts for this example. As shown, at time $t_1$ (15 usec), due to an external event, such as a collision with a high energy particle, the voltage across one of the capacitors (hereinafter impacted capacitor) is assumed to have increased from 1.2V to nearly 4.0 Volts. The voltage across the impacted capacitor is allowed to discharge at substantially the same rate and times as the other two capacitors. However, as a result of the local Set and Reset feedback signals, the impacted capacitor is caused to float, as shown between times $t_2$ and $t_3$, when the other two capacitors are charging. The discharging and floating of the impacted capacitor continues until the voltage across it falls below reference voltage Vref2. When this happens, the impacted capacitor is enabled to charge and discharge at the same rate and synchronously with the other two capacitors. This illustrates the ability of the circuit to recover from a temporary fault.

Figure 5:
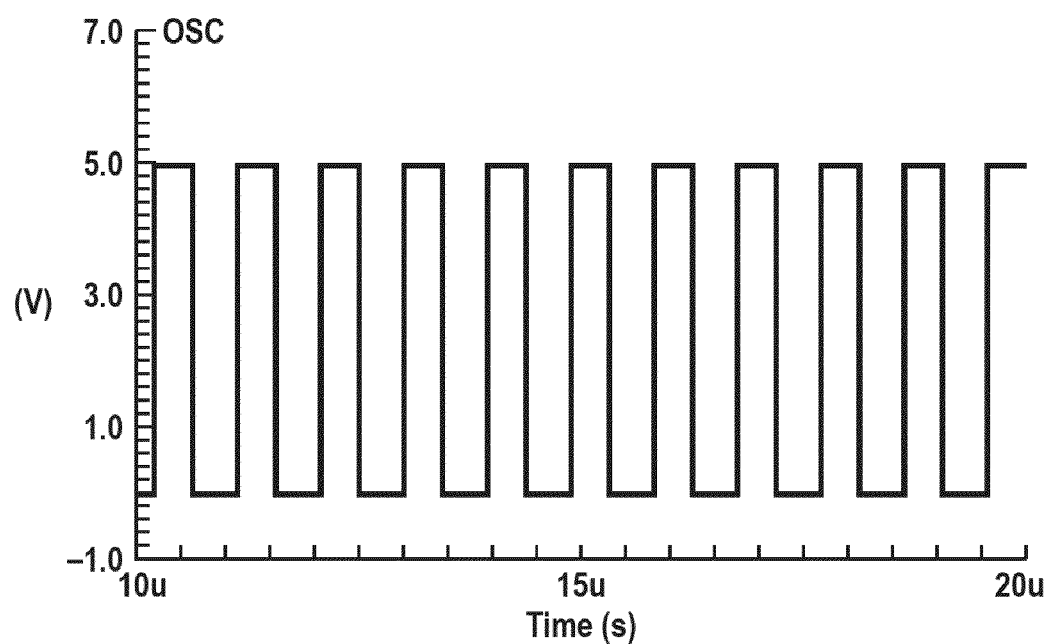
FIG. 5 shows an exemplary oscillation frequency of the clock signal generated by the clock generation circuit of FIG. 3.

FIG. 5 shows the oscillation of output signal OSC over the same time period as shown in FIG. 4. Although a single-event transient at time $t_1$ has caused the voltage across one of the redundant capacitors to briefly fall outside of the range defined by Vref to Vref2 range, the OSC signal is not affected. This illustrates the ability of the circuit to provide a proper output signal during a single fault. In the example shown in FIG. 5, signal OSC has an amplitude varying between 0 and 5 volts.

FIG. 6 shows computer simulation plots 400, 405, and 410 of capacitor voltages associated with redundant clock generators $350_1$, $350_2$ and $350_3$, respectively, in accordance with another example. FIG. 7 shows the Set and Reset signals associated with this simulation. Namely, plots 415 and 420 are associated with signals Set and Reset signals generated by redundant clock generator $350_3$; plots 425 and 430 are associated with signals Set and Reset signals generated by redundant clock generator $350_2$, and plots 435 and 440 are associated with signals Set and Reset signals generated by redundant clock generator $350_1$. Plot 450 is the OSC output from the RS Flip Flop 374.

In generating the simulation results shown in FIGS. 6 and 7, reference currents ($I_{REF}$ supplied to clock generators $350_1$, $350_2$ and $350_3$ were set to be 2 micro-amps, 3 micro-amps and 4 micro-amps, respectively, to demonstrate the advantages of the embodiments of the present invention. It is understood, however, that in practice these currents may be different from one another by only a few percent, caused by manufacturing process variations. Reference voltages Vref and Vref2, which are independently generated in each clock generator from the global reference voltage Vrefglobal, are respectively shown to be 0.6 volts and 1.2 volts.

The ramp rate of the capacitor disposed in clock generator $350_3$, namely plot 400, is shown as being faster than that of the other two capacitors, due to the higher reference current supplied to this capacitor. The voltage across the capacitor disposed in clock generator $350_3$ is shown as exceeding the reference voltage Vref2 at time T1. Accordingly, at time near T1, clock generator $350_3$ asserts its associated set signal $Set_3$ (see plot 415 of FIG. 7) thus causing the capacitor disposed in clock generator $350_3$ to float.

The voltage developed across the capacitor disposed in clock generator $350_2$, namely Plot 410, is shown as exceeding the reference voltage Vref2 at time T2. Accordingly, clock generator $350_2$ asserts its associated set signal $Set_2$ at time near T2 (see plot 425 of FIG. 7) thus causing the capacitor disposed in clock generator $352_2$ to float. The assertions of the two set signals, namely $Set_2$ and $Set_3$, causes voter 370 to change state, in turn, causing signals Osc and $\overline{OSC}$ to change state, in turn causing all 3 capacitors to start discharging at time T3, as shown in FIG. 6.

The voltage across the capacitor disposed in redundant clock generator $350_3$ is shown as falling below the reference voltage Vref at time T4. Accordingly, at time near T4, signal $Reset_3$ is asserted (see plot 420 of FIG. 7) thus causing this capacitor within $350_3$ to float. The voltage across the capacitor disposed in clock generator $350_2$ is shown as falling below the reference voltage Vref at time T5. Accordingly, at time near T5, signal Reset2 is asserted (see plot 430 of FIG. 7) thus causing the capacitor within $350_2$ to float. The assertions of the two reset signals, namely $Reset_2$ and $Reset_3$, causes voter 372 to change state, thus changing the state of signals OSC, $\overline{OSC}$ and causing the capacitors to start charging at time T6, as shown in FIG. 6. The ramp rate of the capacitor in clock generator $350_1$ namely plot 405 in FIG. 6 is shown as being very slow. Because the voltage across the capacitor disposed in block $350_1$ does not exceed the higher reference voltage of 1.2V, signal $Set_1$ does not get asserted; however, because the voltage across this capacitor falls below the lower reference voltage of 600 mV between the times T5 and T6, signal $Reset_1$ is also asserted, as shown in plot 440.

Referring to FIG. 3, In one embodiment, reference voltage Vrefglobal is generated by a bandgap circuit, as is well known. Amplifier 320 may be an operational amplifier having a closed loop dc gain defined by the resistance of resistors 322 and 324. Amplifier 320 is used to generate reference voltages Vref and Vref2 from global reference voltage Vrefglobal.

Figure 8:
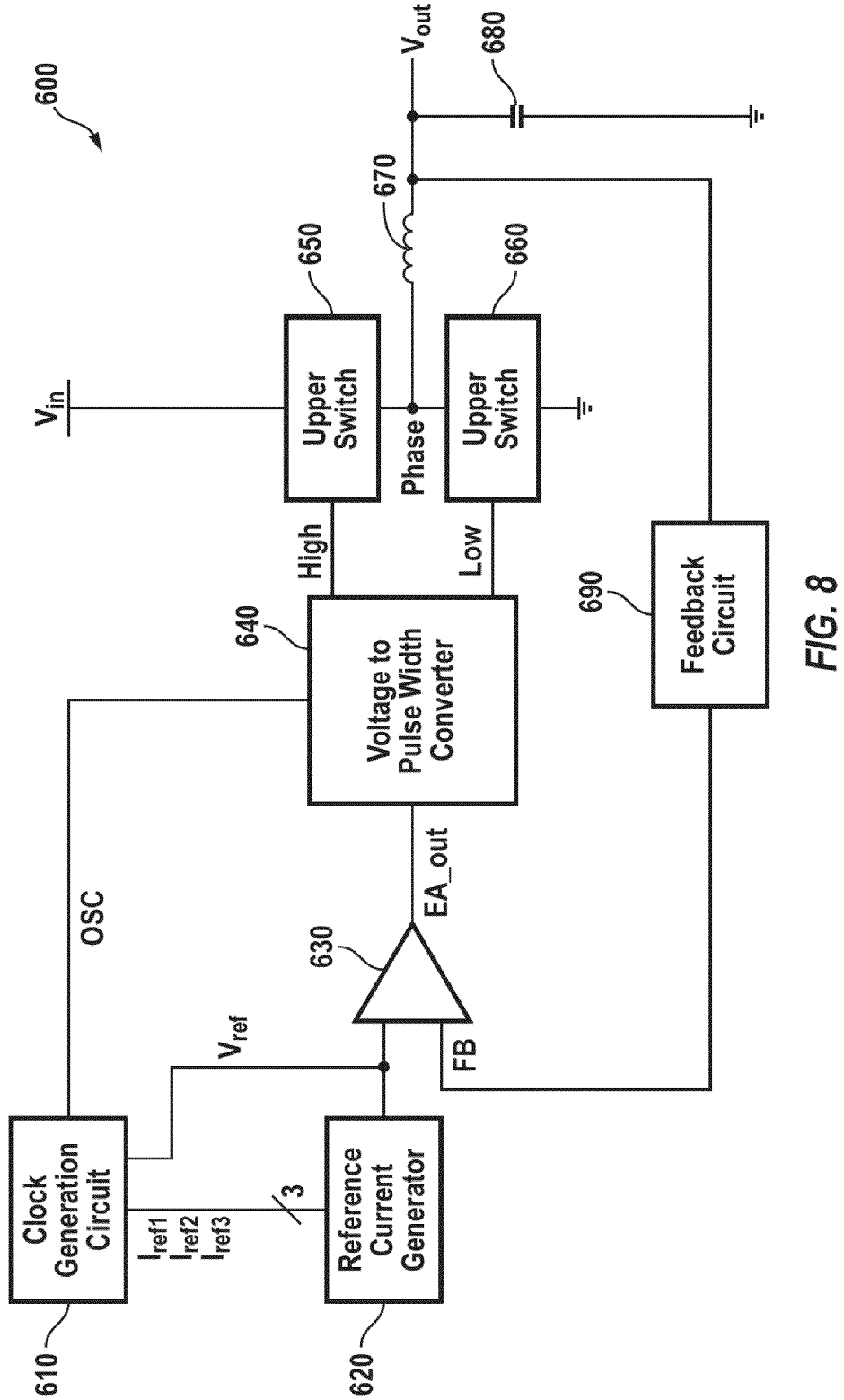
FIG. 8 is a simplified block diagram of a DC-DC synchronous buck converter having a clock generation circuit, in accordance with one exemplary embodiment of the present invention.

FIG. 8 is a simplified block diagram of a DC-DC synchronous buck converter 600 having a clock generation circuit 610, in accordance with one exemplary embodiment of the present invention. The DC-DC synchronous buck converter 600 is shown as including, a clock generation circuit 610, a reference current generator 620, an operational amplifier 630, a voltage-to-pulse-width converter 640, an upper switch 650, a lower switch 660, an inductor 670, a capacitor 680, and a feedback circuit 690. Clock generation circuit 610 receives reference voltage $V_{ref}$ and reference currents $I_{ref1}$, $I_{ref2}$, and $I_{ref3}$ and, in response, generates clock signal OSC. Operational amplifier 630 varies its output voltage EA_Out to keep the feedback voltage at node FB substantially equal to voltage $V_{ref}$. The voltage-to-pulsewidth converter 640 receives the voltage signal EA_out and the clock circuit signal OSC, and in response, varies the pulse width of its output signals High and Low. Signal High, when asserted, turns on upper switch 650, thereby causing the current through inductor 670 to increase via input voltage $V_{in}$. Signal Low, when asserted, turns on lower switch 660, thereby causing the current through inductor 670 to decrease via the ground terminal. The increasing and decreasing current through inductor 670 is filtered by capacitor 680 to set the output voltage $V_{out}$. Output voltage $V_{out}$ is applied to feedback circuit 690 which, in turn, applies it's output signal at node FB to amplifier 630. The duty cycle of the signal at node Phase, which is common to upper and lower switches 650, 660 sets the output voltage $V_{out}$. The inductor 670 and capacitor 680 form a low pass filter. Output voltage $V_{out}$ has a valued defined by the product of input $V_{in}$ and the duty cycle of the signal at node Phase. The feedback signal FB ensures that the duty cycle of the signal at node Phase is changed as necessary to maintain the desired output voltage $V_{out}$.

The above embodiments of the present invention are illustrative and not limiting. Various alternatives and equivalents are possible. The invention is not limited by the type of switching circuit, amplifier, comparator, etc., used in the clock generator. The invention is not limited to the type or the number of redundant blocks or voters. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A clock generation circuit comprising:
   a first comparator responsive to a first input voltage signal, said first comparator being adapted to change a first output voltage signal when the first input voltage is detected as being greater than a first reference voltage, and further to change a second output voltage signal when the first input voltage is detected as being smaller than a second reference voltage;
   a first logic unit responsive to the first comparator and adapted to generate a pair of complementary clock signals in response to the first and second output voltage signals; and
   a first switching circuit adapted to vary the first input voltage in response to the first and second output voltages and the pair of complementary clock signals.

2. The clock generation circuit of claim 1 further comprising:
   a current source adapted to supply a reference current to the first switching circuit; and
   a capacitor adapted to charge, discharge or float in response to first switching circuit.

3. The clock generation circuit of claim 2 wherein said capacitor is disposed between the current source and the comparator.

4. The clock generation circuit of claim 1 further comprising:
   a second comparator responsive to a second input voltage signal, said second comparator being adapted to change a third output voltage signal when the second input voltage is detected as being greater than a third reference voltage, and further to change a fourth output voltage signal when the second input voltage is detected as being smaller than a fourth reference voltage;
   a second switching circuit adapted to vary the second input voltage in response to the third and fourth output voltages and the pair of complementary clock signals;
   a third comparator responsive to a third input voltage signal, said third comparator being adapted to change a fifth output voltage signal when the third input voltage is detected as being greater than a fifth reference voltage, and further to change a sixth output voltage signal when the third input voltage is detected as being smaller than a sixth reference voltage;
   a third switching circuit adapted to vary the third input voltage in response to the fifth and sixth output voltages and the pair of complementary clock signals; said logic unit being responsive to the third, fourth, fifth and sixth output voltages.

5. The clock generation circuit of claim 4 further comprising first and second voters responsive to the first, second and third comparators.

6. The clock generation circuit of claim 4 wherein each of said first, second and third switching circuits comprises first, second, third, fourth, fifth and sixth transistor, said first transistor receiving a reference current at a first terminal and a first one of the pair of complementary clock signals at its second input terminal, said second transistor receiving the reference current at a first terminal and a second one of the pair of complementary clock signals at its second input terminal, said third transistor having a first terminal coupled to a third terminal of the first transistor and a second terminal receiving a first output voltage of an associated comparator, said fourth transistor having a first terminal coupled to a third terminal of the second transistor and a second terminal receiving a second output voltage of the associated comparator, said fifth transistor having first and second terminals coupled to a third terminal of the third transistor, and a third terminal coupled to a voltage supply or ground, said sixth transistor having a first terminal coupled to a third terminal of the fourth transistor, a second terminal coupled to the second terminal of the fifth transistor and a third terminal coupled to the voltage supply or ground.

7. A clock generation circuit comprising:
   N clock generators each comprising:
      a comparator adapted to compare an input voltage to each of M reference voltages and to assert M output signals in response;
      a switching circuit responsive to an associated comparator's M output signals and to a pair of oscillating feedback signals, said switching circuit adapted to generate the input voltage in response;
   M voters responsive to the M output signals of the N comparators; and
   a logic unit responsive to the voters and generating the pair of oscillating feedback signals in response.

8. A method of generating a clock signal, the method comprising:
   changing a first comparison signal when a first capacitor voltage is detected as being greater than a first reference voltage;
   changing a second comparison signal when the first capacitor voltage is detected as being smaller than a second reference voltage;
   enabling the first capacitor to charge in response to the first and second comparison signals and a pair of complementary oscillating feedback signals when the first capacitor voltage is detected as being smaller than the first reference voltage;
   enabling the first capacitor to discharge in response to the first and second comparison signals and the pair of complementary oscillating feedback signals when the first capacitor voltage is detected as being greater than the second reference voltage; and
   enabling the first capacitor to float in response to the first and second comparison signals and the pair of complementary oscillating feedback signals when the first capacitor voltage is detected as being smaller than the second reference voltage or greater than the first reference voltage.

9. The method of claim 8 further comprising:
   changing a third comparison signal when a second capacitor voltage is detected as being greater than a third reference voltage;
   changing a fourth comparison signal when the second capacitor voltage is detected as being smaller than a fourth reference voltage;
   enabling the second capacitor to charge in response to the third and fourth comparison signals and the pair of complementary oscillating feedback signals when the second capacitor voltage is detected as being less than the third reference voltage;
   enabling the second capacitor to discharge in response to the third and fourth comparison signals and the pair of complementary oscillating feedback signals when the second capacitor voltage is detected as being greater than the fourth reference voltage;
   enabling the second capacitor to float in response to the third and fourth comparison signals and the pair of complementary oscillating feedback signals when the second capacitor voltage is detected as being smaller than the fourth reference voltage or greater than the third reference voltage;

changing a fifth comparison signal when a third capacitor voltage is detected as being greater than a fifth reference voltage;

changing a sixth comparison signal when the third capacitor voltage is detected as being less than a sixth reference voltage;

enabling the third capacitor to charge in response to the fifth and sixth comparison signals and the pair of complementary oscillating feedback signals when the third capacitor voltage is detected as being less than the fifth reference voltage;

enabling the third capacitor to discharge in response to the fifth and sixth comparison signals and the pair of complementary oscillating feedback signals when the third capacitor voltage is detected as being greater than the sixth reference voltage;

enabling the third capacitor to float in response to the fifth and sixth comparison signals and the pair of complementary oscillating feedback signals when the third capacitor voltage is detected as being smaller than the sixth reference voltage or greater than the fifth reference voltage;

applying the first, third and fifth comparison signals to a first majority voter;

applying the second, fourth and sixth comparison signals to a second majority voter; and varying the pair of complementary oscillating feedback signals in response to a change in an output signal of the first or second majority voter.

10. A pulse-width modulated DC-DC converter comprising:
- an inductor;
- a first switch adapted to cause a current in the inductor to increase;
- a second switch adapted to cause the current in the inductor to decrease;
- a feedback circuit responsive to the inductor;
- an amplifier responsive to the feedback circuit;
- a clock generation circuit comprising:
  - a comparator responsive to a first input voltage signal, said comparator being adapted to change a first voltage signal when the first input voltage is detected as being greater than a first reference voltage, and further to change a second voltage signal when the first input voltage is detected as being smaller than a second reference voltage;
  - a first logic unit responsive to the comparator and adapted to generate a clock signal in response to the first and second voltage signals; and
  - a first switching circuit adapted to vary the first voltage in response to the first and second voltages and the clock signal; and
- a voltage-to-pulse width converter responsive to the clock signal and an output signal of the amplifier.

* * * * *